US009570388B2

(12) United States Patent
Christensen et al.

(10) Patent No.: US 9,570,388 B2
(45) Date of Patent: Feb. 14, 2017

(54) FINFET POWER SUPPLY DECOUPLING

(71) Applicant: International Business Machines Corporation, Armonk, NY (US)

(72) Inventors: Todd A. Christensen, Rochester, MN (US); John E. Sheets, II, Zumbrota, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/752,399

(22) Filed: Jun. 26, 2015

(65) Prior Publication Data

US 2016/0379928 A1  Dec. 29, 2016

(51) Int. Cl.
*H01L 23/522* (2006.01)
*H01L 23/50* (2006.01)
*H01L 27/088* (2006.01)
*H03K 17/04* (2006.01)

(52) U.S. Cl.
CPC ........... *H01L 23/5222* (2013.01); *H01L 23/50* (2013.01); *H01L 27/0886* (2013.01); *H03K 17/04* (2013.01)

(58) Field of Classification Search
CPC .. H01L 23/5222; H01L 23/50; H01L 27/0866; H03K 17/04
USPC .......................... 327/108, 109, 110, 111, 112
See application file for complete search history.

(56) References Cited

U.S. PATENT DOCUMENTS

| | | | |
|---|---|---|---|
| 6,909,135 B2 | 6/2005 | Nii et al. | |
| 6,924,187 B2 | 8/2005 | Ishikura et al. | |
| 7,476,946 B2 | 1/2009 | Bryant et al. | |
| 8,546,851 B2 | 10/2013 | Furuta et al. | |
| 8,692,306 B2 | 4/2014 | Chen | |
| 2008/0203562 A1 | 8/2008 | Araki et al. | |
| 2013/0200449 A1* | 8/2013 | Chen ............... | H01L 21/823431 257/296 |
| 2014/0151810 A1* | 6/2014 | Maeda .............. | H01L 29/41791 257/365 |
| 2014/0167172 A1 | 6/2014 | Chen et al. | |

* cited by examiner

*Primary Examiner* — John Poos
(74) *Attorney, Agent, or Firm* — Patterson + Sheridan, LLP

(57) ABSTRACT

Embodiments herein describe dummy gates disposed over a portion of a fin in finFETs. That is, instead of separating the dummy gates from the finFET structure, the fins may be extended and covered, at least partially, by the dummy gates. An insulative material is disposed between the dummy gate and the fin in order to form a decoupling capacitor. In one embodiment, the dummy gate overlaps a portion of the fin that is held at a voltage rail. Moreover, the dummy gate may be coupled to a different (e.g., opposite) voltage rail than rail coupled to the fin. For example, if the fin is coupled to $V_{HIGH}$ then the dummy gate is coupled to $V_{LOW}$, or vice versa. Thus, the capacitor formed using the fin and the dummy gate provides a decoupling capacitance between the power sources generating the voltage rails (i.e., $V_{HIGH}$ and $V_{LOW}$).

16 Claims, 5 Drawing Sheets

FINFET POWER SUPPLY DECOUPLING

BACKGROUND

The present invention relates to incorporating decoupling capacitance into a fin field effect transistor (FET) structure, and more specifically, to the interaction between a fin in the finFET and a dummy gate.

FinFET semiconductor technology provides improved transistor performance versus historic planar FET technologies. However, finFETs have much larger gate capacitances when compared to similar sized planar FETs. This increased gate capacitance can have negative effects on the power supplies used to provide the rail voltages to the finFETs which may cause the rail voltages to droop as the gates are switched. This droop can decrease the switching speed of the finFETs and negatively affect the overall timing of the semiconductor chip.

SUMMARY

According to one embodiment of the present invention is a finFET that includes a fin extending in a first direction on a substrate and a gate extending in a second direction on the substrate substantially perpendicular to the first direction, where the gate is disposed over a first portion of the fin in order to selectively activate a conductive channel in the first portion of the fin in response to a time-varying gate signal. Moreover, the finFET includes a dummy fin structure extending in the second direction on the substrate and overlapping a second portion of the fin, where the dummy gate is coupled to a first voltage rail. The finFET also includes a conductive contact contacting a third portion of the fin located between the first and second portions, the contact electrically coupling the third portion of the fin to a second voltage rail different from the first voltage rail.

Another embodiment of the present invention is an integrated circuit that includes a fin extending in a first direction on a substrate and a gate extending in a second direction on the substrate substantially perpendicular to the first direction, where the gate is disposed over a first portion of the fin in order to selectively activate a conductive channel in the first portion of the fin in response to a time-varying gate signal. Moreover, the integrated circuit includes a dummy fin structure extending in the second direction on the substrate and overlapping a second portion of the fin, where the dummy gate is coupled to a first voltage rail. The integrated circuit also includes a conductive contact contacting a third portion of the fin located between the first and second portions, the contact electrically coupling the third portion of the fin to a second voltage rail different from the first voltage rail.

Another embodiment of the present invention is of operating a finFET. The method includes driving a time-varying gate signal onto a gate extending in a first direction on a substrate, where the gate is disposed over a first portion of a fin extending in a second direction on the substrate substantially perpendicular to the first direction, and where the time-varying signal selectively activates a conductive channel in the first portion of the fin. While driving the time-varying gate signal, the method includes driving a first DC voltage on a dummy fin structure extending in the second direction on the substrate where the dummy fin structure overlaps a second portion of the fin. While driving the time-varying gate signal, the method also includes driving a second DC voltage different from the first DC voltage on a conductive contact contacting a third portion of the fin that is located between the first and second portions.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The increased gate capacitance of finFETs relative to planar FET technologies may cause the rail voltages coupled to the finFETs to droop as the gate voltages change. As mentioned above, this droop can have a negative impact on the timing of the semiconductor circuit—e.g., force the finFETs to operate at slower frequencies that would otherwise be possible. To counter the effects of the gate capacitance, dummy fin structures (referred to herein as "dummy gates") can be placed over a portion of a fin in the finFETs. Instead of separating the dummy gates from the finFET structure, one or more fins may be extended and covered, at least partially, by the dummy gates. An insulative material is disposed between the dummy gate and the fin in order to form a decoupling capacitor.

In one embodiment, the dummy gate overlaps a portion of the fin that is driven to a voltage rail. Moreover, the dummy gate may be coupled to a different (e.g., opposite) voltage rail than the rail coupled to the fin. For example, the fin may be coupled to $V_{HIGH}$ (e.g., VDD), while the dummy gate is coupled to $V_{LOW}$ (e.g., VSS), or vice versa. In this manner, the capacitor formed using the fin and the dummy gate provides a decoupling capacitance between the power sources generating the voltage rails (i.e., $V_{HIGH}$ and $V_{LOW}$). This decoupling capacitance mitigates the negative effects of the large gate capacitance in the finFETs and may reduce or prevent the voltage rails from drooping, thereby permitting the finFETs to operate at faster frequencies.

Figure 1:
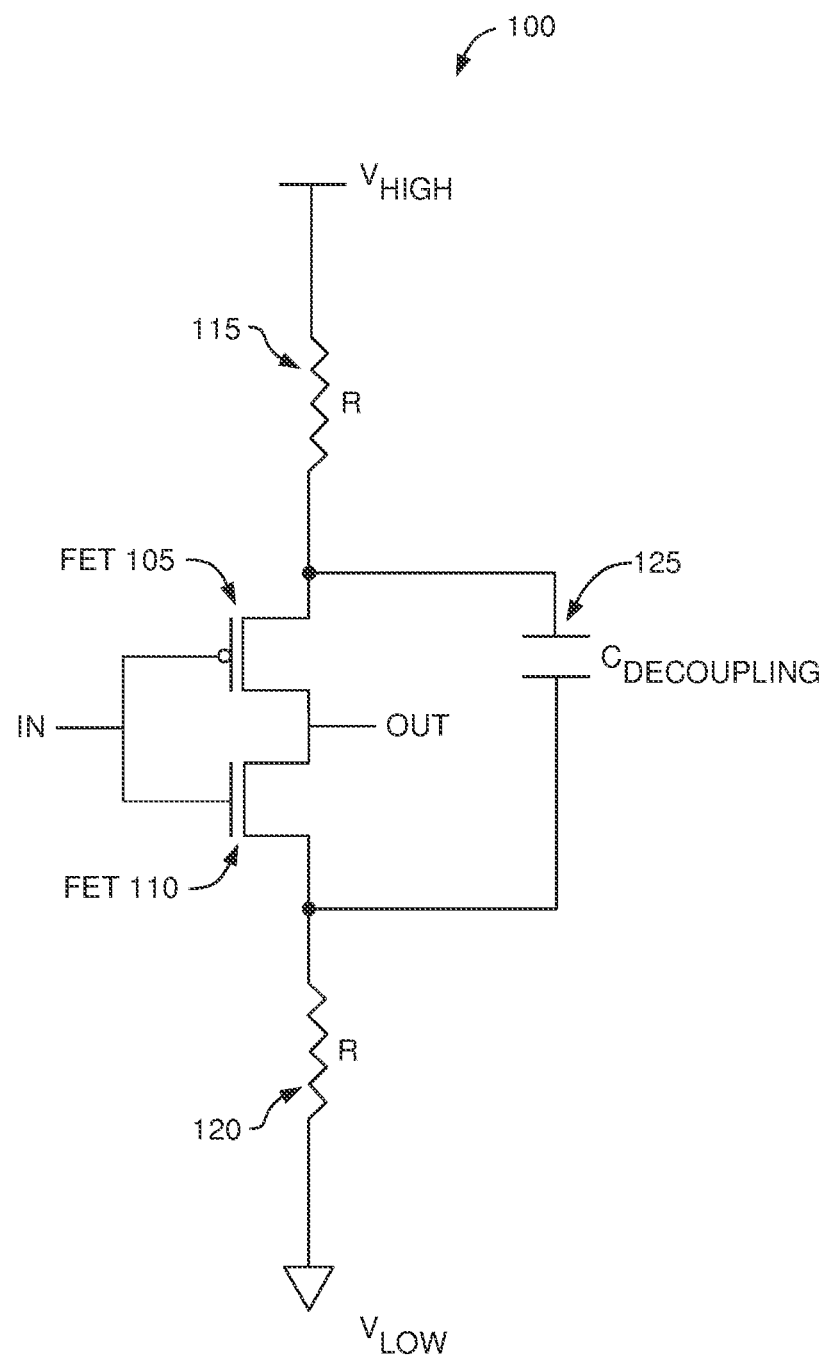
FIG. 1 is a circuit diagram that includes a decoupling capacitor, according to one embodiment.

FIG. 1 is a circuit diagram 100 that includes a decoupling capacitor 125, according to one embodiment. The circuit 100 includes an inverter formed by finFET 105, finFET 110, power path resistances 115 and 120, and decoupling capacitor 125. An IN signal drives the gates of the finFETs 105 and 110 such that the gates voltages are complementary. In this example, FET 105 is a pfinFET while FET 110 is a nfinFET.

Thus, when IN is high, finFET 110 is activated (and finFET 105 is deactivated) and the OUT signal is driven to $V_{LOW}$. When IN is low, finFET 105 is activated (and finFET 110 is deactivated) and the OUT signal is driven to $V_{HIGH}$.

The power path resistances 115 and 120 represent the electrical resistance between the power supplies and the FETs 105 and 110. Because the power supplies may be located at a different location on a semiconductor chip (or off the chip) than the FETs 105 and 110, the electrical path between these elements is represented by the resistances 115 and 120. The resistances 115, 120 represent the inherent resistance of the electrical path between the finFETs 105, 110 and the power supplies. For example, the electrical path between the FETs 105, 110 and the power supplies may include different metal layers, electrical vias, traces, and the like which each add some resistance. Because of the power path resistances 115 and 120, the voltage at FET 105 may be less than $V_{HIGH}$, while the voltage at FET 110 may be greater than $V_{LOW}$.

In one embodiment, the finFETS 105 and 110 have respective gate capacitances (i.e., the capacitance between the gate and the fin) which may cause the voltage rails $V_{HIGH}$ and $V_{LOW}$ to droop as the gate voltages switch. To mitigate this droop, the decoupling capacitor 125 is coupled between the voltages rails $V_{HIGH}$ and $V_{LOW}$. Because the capacitor 125 is located at (or near) the same location as the FETs 105, 110 in the chip, the capacitor 125 is not affected by the resistances 115 and 120—i.e., the electrical resistance between the capacitor 125 and the finFETs 105, 110 is small relative to the resistances 115, 120.

The capacitor 125 provides a decoupling capacitance that "decouples" the voltage rails from the noise (i.e., droop) caused by the large gate capacitances of the FETs 105 and 110. To do so, in one embodiment, the capacitor 125 uses its stored charge to maintain the voltage rails close to their desired value by mitigating or preventing the droop caused when the FETs 105 and 110 switch. For example, when the switching FETs 105 and 110 cause the voltage rail to dip, this change in voltage is countered by charge flowing from the capacitor 125. Put differently, the capacitor 125 serves as a secondary (local) power source which can be used to inject or sink current in order to maintain the voltage rails close to $V_{HIGH}$ and $V_{LOW}$.

Figure 2:
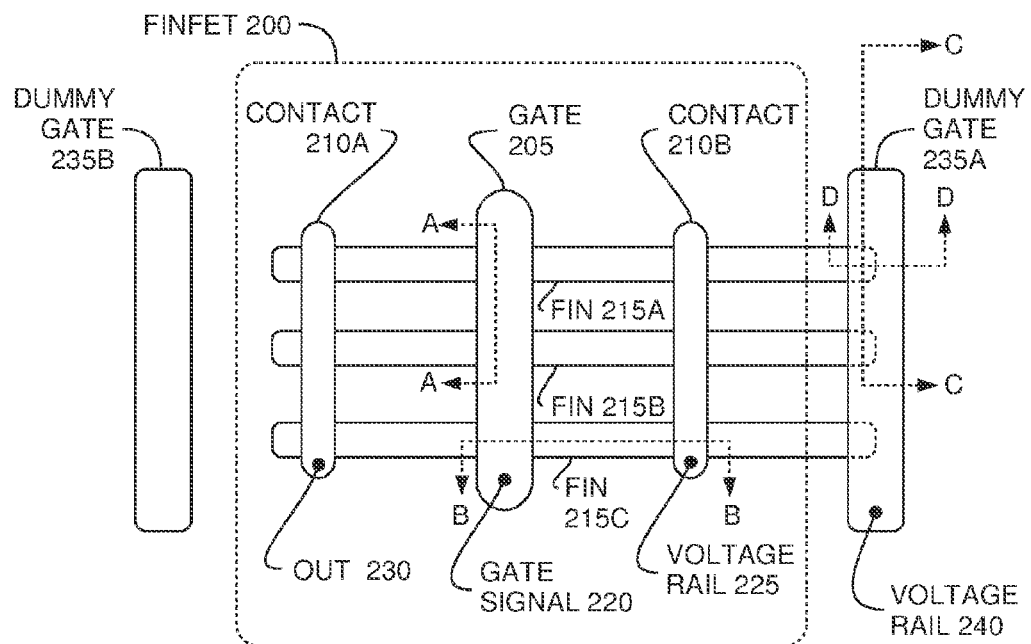
FIG. 2 illustrates a finFET with dummy gates, according to one embodiment.

FIG. 2 illustrates a finFET 200 and dummy gates 235, according to one embodiment. The finFET 200 includes a gate 205 that overlaps three fins 215A, 215B, and 215C to form gate capacitors. In this example, the gate 205 is substantially perpendicular to the fins 215. As used herein, "substantially perpendicular" means the two structures are perpendicular to each other given the limits of fabrication processes used to manufacture the structures. For example, two structures which are substantially perpendicular may intersection to form an angle that is 90 degrees+/−5 degrees. The finFET 200 also includes contacts 210A and 210B which have direct electrical connections to the underlying fins 215. Because contact 210A couples to each of the portions of the fins 215 to the left of gate 205, these portions of the fins 215 may be driven to the same voltage. Similarly, because contact 710B couples to each of the portions of the fins 215 to the right of gate 205, these portions of the fins 215 may be driven to the same voltage.

The gate 205 may be made from silicide, polysilicon, metal, or any conductive material. The contacts 210 may be silicide, metal, or any conductive material. The fins 215 may be a crystalline semiconductor such as crystalline silicon. Moreover, the different portions of the fins 215 may be doped differently—i.e., either n-type or p-type. For example, the portions of the fins 215 to the left and right of the gate 205 may have higher dopant concentrations than the portions of the fins 215 underneath the gate 205.

In operation, a gate signal 220 drives a voltage onto the gate 205. Depending on whether the finFET 200 is a pFET or nFET, driving a first voltage on the gate 205 causes the charge carries (e.g., holes or electrons) in the fins 215 underneath the gate 205 to form a conductive channel between the left and right portions of the fins 215. When voltage driven by the gate signal 220 forms the conductive channel (i.e., the finFET 200 is activated), the left and right portions of the fins 115 are electrically connected and the out signal 230 is driven to voltage rail 225. As used herein, the "voltage rails" are constant DC voltages generated by power supplies. In one embodiment, the voltage rails are not intended to vary (although there may be some unintended droops in the voltage as discussed above) in contrast to control signals such as the gate signal 220 which change voltages to activate and deactivate the finFETs. During other time periods, the gate signal 220 drives a second voltage onto the gate 205 which ensures that no conductive channel is formed in the fins 215 (i.e., the finFET 200 is deactivated), thereby preventing current from flowing between the left and right portions. In this scenario, the out signal 230 is electrically floating.

FIG. 2 also includes two dummy gates 235A and 235B. In one embodiment, the dummy gates 235 cause the fabrication process used to manufacture the semiconductor chip containing finFET 200 to be more uniform. For example, the dummy gates 235 may be used to ensure the chip achieves a predetermined gate density requirement. Doing so may provide a flatter processing surface when fabricating layers disposed above the current layer shown in FIG. 2. In addition, dummy gate 235A provides a decoupling capacitance between the voltage rails 225 and 240 in the semiconductor chip. As shown, dummy gate 235A overlaps at least a portion of the fins 215. Specifically, dummy gate 235A overlaps the right most ends of the fins 215. Although not show here, a thin layer of dielectric material (e.g., silicon dioxide) is disposed between the fins 215 and the dummy gate 235A thereby creating the decoupling capacitance. In one embodiment, the dummy gate 235A does not make a direct ohmic contact with the fins 215 but is only capacitively coupled to the fins 215.

For example, the capacitor formed by the right most ends of the fins 215 and the dummy gate 235A may be represented by the decoupling capacitor 125 shown in FIG. 1. To provide the decoupling capacitance, the dummy gate 235A has a direct electrical connection to voltage rail 240 (e.g., $V_{HIGH}$) that is the different from the voltage rail 225 (e.g., $V_{LOW}$). Stated generally, the dummy gate 235A can be connected to any voltage rail 240 which a designer wishes to capacitively couple to another voltage rail in the finFET 200. As described above, using the fins 215 and dummy gate 235A to form a decoupling capacitor may enable charge to be stored in the capacitor to mitigate drooping in the voltage rail 225 coupled to the fins 215 caused by the finFET 200 switching between activate and inactive states in response to the gate signal 220.

In one embodiment, the dummy gate 235A overlaps only portions of the fins 215 that are directly driven by a voltage rail, which in FIG. 2, are the portions of the fins 215 to the right of the gate 205 that are directly coupled to contact 210B. In contrast, the portions of the fins 215 to the left of the gate 205 are selectively coupled to the voltage rail 225 when the gate 205 forms the conductive channel, and thus, do not have direct electrical connection to any voltage rail.

The portions of the fins 215 to the right of gate 205, however, are always electrically coupled to the voltage 225, regardless of the state of the finFET 200. Moreover, although the dummy gate 235A overlaps the fins 215 on the right of the contact 210B, in another embodiment, the dummy gate 235A may be overlap the fins 215 in the region between the gate 205 and the contact 210B.

The dummy gate 235B, however, does not overlap the fins 115 and is not used as a decoupling capacitor. For example, the dummy gate 235B may be used to satisfy the predetermined gate density or alter a timing characteristic (e.g., coupling capacitance) but is not used to mitigate the droop caused by switching the states of the finFET 200. The dummy gate 235B may be electrically floating or tied to a voltage rail. If the dummy gate 235B was shifted to the right such that it covered a portion of the fins 215, because this portion of the fins 215 do not have a direct electrical connection to the voltage rail 225, doing so may increase the gate capacitance and exasperate the drooping issue described above. Thus, not every dummy gate 235 in the finFET 200 needs to overlap the fins 215. Indeed, it may be advantageous for the dummy gates 235 near portions of the fins 215 that are not directly coupled to a voltage rail to be spaced away from the finFET 200 to reduce any capacitive coupling between the dummy gate 235B and the FET 200.

Figure 3:
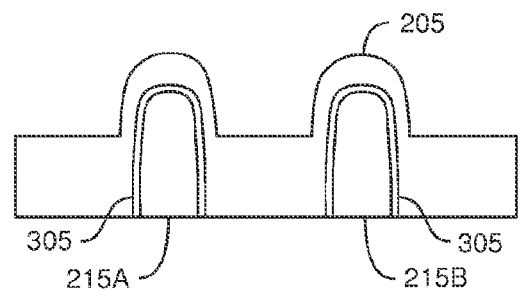
FIG. 3 illustrates one view of the finFET in FIG. 2, according to one embodiment.

FIG. 3 illustrates one view of the finFET in FIG. 2, according to one embodiment. Specifically, FIG. 3 illustrates the cross section indicated by A-A in FIG. 2. Along this cross section, the gate 205 surrounds the fins 215A and 215B on three sides—i.e., a top side, left side, and right side. An insulative material 305 (e.g., a gate oxide) is disposed between the fins 215A, 215B and the gate 205. The insulative material may be, for example silicon dioxide or any other non-conductive material. As shown here, the gate 205, insulative material 305, and fins 215A, 215B form gate capacitors that permit the conductive channels to form in the fins 215. One advantage of using the fin structures relative to planar FETs is that greater gate capacitance can be achieved in smaller lateral directions. Put differently, because of the 3D nature of the fin structure which permits the gate 205 to surround the fins 215 on three surfaces rather than just one surface, the finFETs may use less real estate on a semiconductor chip, thereby increasing the density of switching logic on the semiconductor chip.

Figure 4:
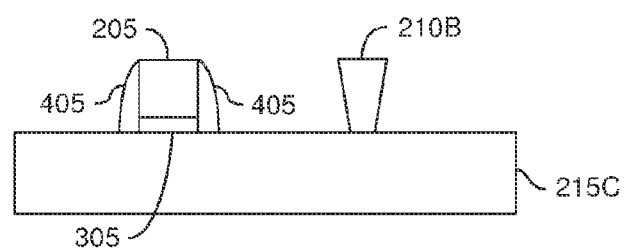
FIG. 4 illustrates one view of the finFET in FIG. 2, according to one embodiment.

FIG. 4 illustrates one view of the finFET in FIG. 2, according to one embodiment. Specifically, FIG. 4 illustrates the cross section indicated by B-B in FIG. 2. This cross section extends along the fin 215C and illustrates portions of the gate 205 and contact 210B which are disposed on the fin 215C. For example, FIG. 4 illustrates where the gate 205 is disposed on the top surface of the fin 215C and is separated from the fin 215C by the insulative material 305. This view, however, does not show the locations where the gate 205 surrounds the fin 215C on the left and right sides as shown in FIG. 3. Moreover, in this embodiment, the finFET includes spacer material 405 disposed between the gate 205 and the fin 215C. The spacers 405 may be used when fabricating the finFET to precisely control the location of the gate 205 in the finFET. For example, the spacers 405 may reduce the likelihood that the gate 205 directly contacts the fin 215C creating an electrical short and preventing the finFET from functioning as intended. Moreover, using the spacer 405 provides a way to control the value of the gate capacitance by ensuring the gate material does not overlap the fin 215C more than is desired. As above, while a large gate capacitance is desired so the finFETs can be switched quickly, too much capacitance generates the voltage droops.

Unlike the gate 205, the conductive contact 210B directly connects both physically and electrically to the fin 215C. As such, the voltage driven onto the contact 210B (i.e., voltage rail 225) is also driven onto the fin 215C. Referring to FIG. 2, if the voltage on gate 205 causes a conductive channel to form between the right and left portions of fin 215C, then the voltage rail 225 is also driven onto the left portion of fin 215C and contact 210A.

Figure 5:
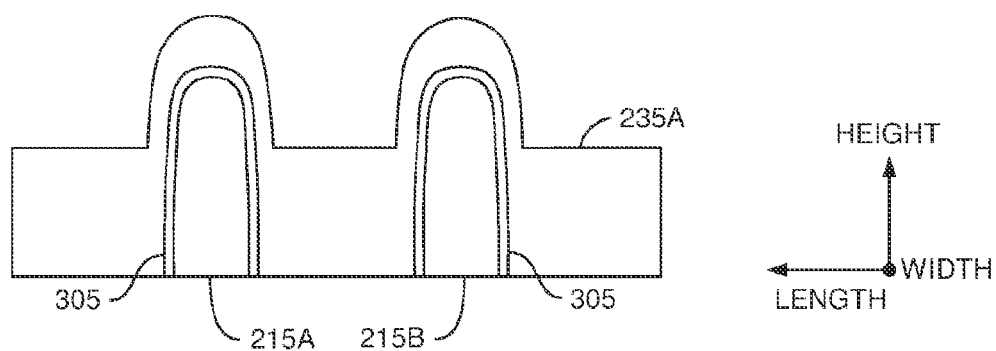
FIG. 5 illustrates one view of the finFET in FIG. 2, according to one embodiment.

FIG. 5 illustrates one view of the finFET in FIG. 2, according to one embodiment. Specifically, FIG. 5 illustrates the cross section indicated by C-C in FIG. 2. In this cross section, the dummy gate 235A surrounds the fins 215A and 215B on three sides—i.e., a top side, left side, and right side—to form decoupling capacitors. Similar to how the gate 205 and the fins 215 generate the gate capacitance, the dummy gate 235A is separated from the fins 215A and 215B by the insulative material 305 to generate the decoupling capacitance. In one embodiment, it may be desired to generate as large a decoupling capacitance as possible and still satisfy fabrication constraints. For example, the decoupling capacitance may be increased by increasing the width of the dummy gate 235A such that more surface area of the dummy gate 235A overlaps the fins 215A and 215B. However, the amount that the dimensions of the dummy gate 235A can be increased may be limited by other considerations such as gate density requirements or using the space taken up by the dummy gates 235 for other purposes such as fabricating additional finFETs.

Figure 6:
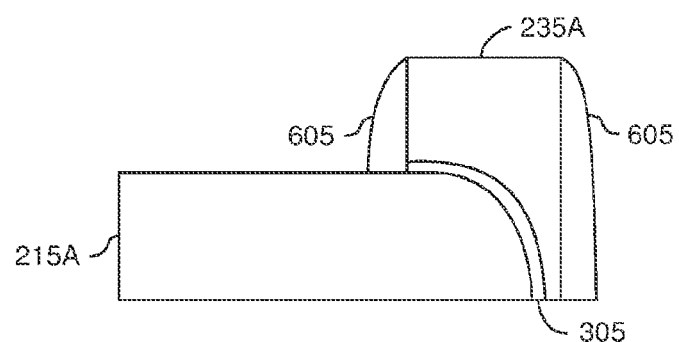
FIG. 6 illustrates one view of the finFET in FIG. 2, according to one embodiment.

FIG. 6 illustrates one view of the finFET in FIG. 2, according to one embodiment. Specifically, FIG. 5 illustrates the cross section indicated by D-D in FIG. 2 which is in a perpendicular direction to the cross section indicated by C-C. When viewed in this direction, FIG. 6 illustrates that the fin 215A does not extend all the way through the dummy gate 235A. In one embodiment, the fin 235A extends as far as it can through the dummy gates 235A and still be covered by the dummy gate material. The distance the fin 235A extends into the dummy gates 235A may be limited by the techniques used to fabricate the finFET. Advantageously, the decoupling capacitance may be larger when the fin 215A does not extend through the dummy gate 235A relative to a finFET where the fin does extend all the way through the width of the dummy gate 235A. Put differently, covering the end (i.e., tip) of the fin 215A with the dummy gate 235A may result in a larger overlap between the dummy gate 235A and the fin 215A thereby increasing the decoupling capacitance.

However, in one embodiment, the finFET may be formed so that the fins 215A, B, and C extend through the dummy gate 235A. For example, aligning the dummy gate 235A and the fins 215 such that the fins 215 extend only partially into the dummy gate 235A may be too difficult (or expensive). In this case, it may be preferred to extend the fins 215 through the dummy gate 235A similar to how the fins 215 extend through the gate 205. Regardless of the particular structure used to generate the decoupling capacitance, the dummy gate 235A is driven to a first voltage rail while the portion of the fin 215 closest to the dummy gate 235A (i.e., the portion of the fin 215 on the same side of the gate 205 as the dummy gate 235A) is driven to a second, different voltage rail. For example, if fin 215A is driven to $V_{HIGH}$, then dummy gate 235A is driven to $V_{LOW}$, or vice versa.

Figure 7:
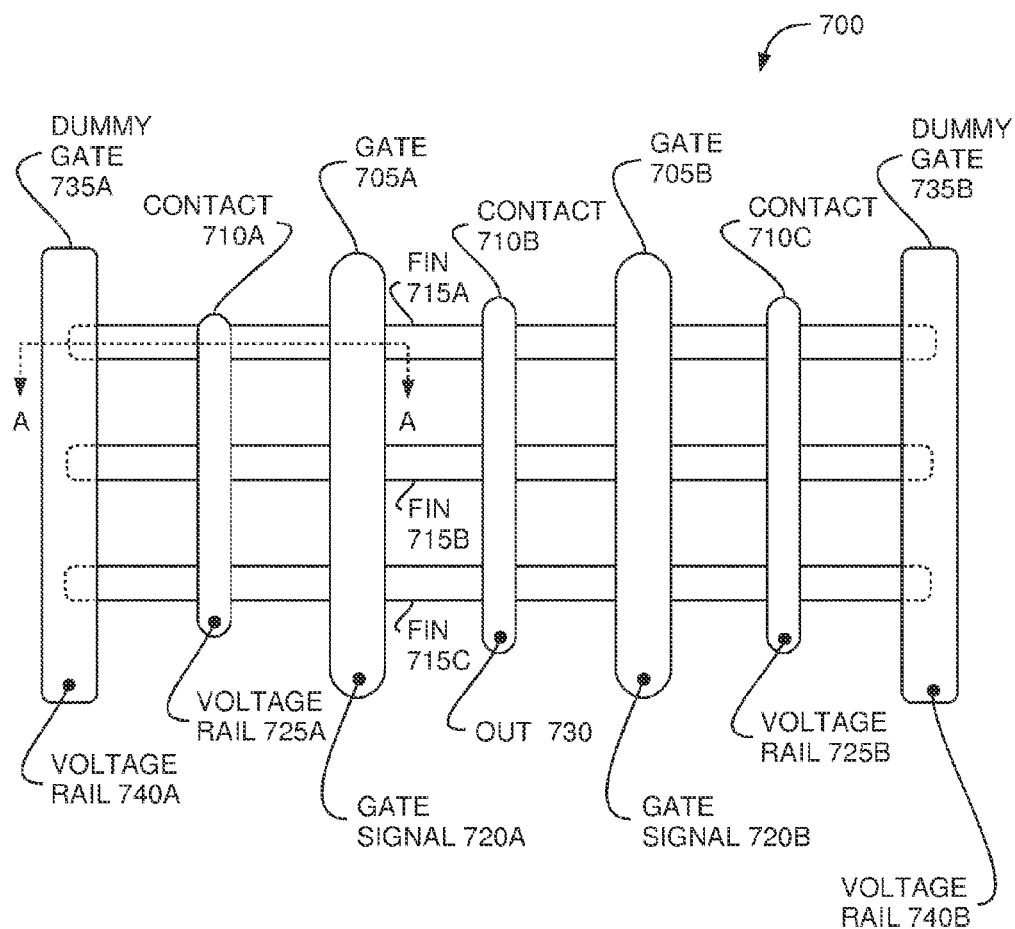
FIG. 7 illustrates a finFET inverter with dummy gates, according to one embodiment.

FIG. 7 illustrates a finFET inverter 700 and dummy gates, according to one embodiment. The inverter 700 includes an nFET and a pFET which share a common output (i.e., OUT signal 730). Specifically, the inverter 700 includes two gates (gate 705A and gate 705B) which activate and deactivate conductive channels in fins 715A, B, and C. In one embodiment, the gates 705 are controlled by the same signal so that if the nFET is activated (i.e., the conductive channel is formed), the conductive channel for the pFET is inactive. To form the nFET and pFET, the doping of the fins 715 is controlled such that one half of each of the fins 715 forms the nFET while the other halves form the pFET. Because only one conductive channel is active at any given time, the contact 710B (and OUT signal 730) is connected to only one of the voltage rails 725 at any given time. For example, if gate signal 720A activates a conductive channel in the fins 715, the contact 710B is electrically coupled to contact 710A and voltage rail 725A. Conversely, and at the same time, gate signal 720B drives a voltage on gate 705B which ensures a conductive channel is not formed in the portion of the fins 715 underneath this gate so that voltage rail 725A is not shorted to the voltage rail 725B.

The inverter 700 also includes dummy gates 735A, 735B that at least partially overlap the fins 715. As shown, dummy gate 735A overlaps the leftmost portions of the fins 715, while dummy gate 735B overlaps the rightmost portions of the fins 715. The dummy gate 735A is driven to voltage rail 740A which is different than the voltage rail 725A driven onto contact 710A, while dummy gate 735B is driven to voltage rail 740B which is different than the voltage rail 725B driven onto contact 710C. In one embodiment, the voltage rail 740A may be the same voltage as voltage rail 725B, while voltage rail 740B is the same voltage as voltage rail 725A. For example, voltage rails 740A and 725B may both be coupled to $V_{HIGH}$, while voltage rails 740B and 725A are both coupled to $V_{LOW}$. In this scenario, the capacitances formed by dummy gates 735A, 735B and fins 715 are in parallel, and thus, add together to increase the overall decoupling capacitance between the voltage rails (e.g., $V_{HIGH}$ and $V_{LOW}$).

Figure 8:
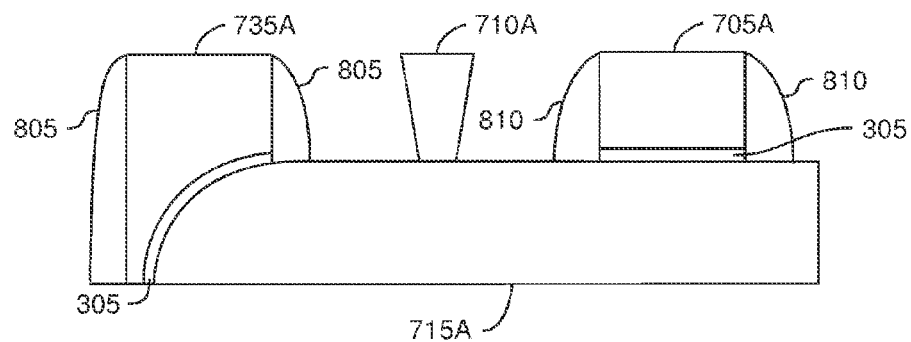
FIG. 8 illustrates one view of the finFET in FIG. 7, according to one embodiment.

FIG. 8 illustrates one view of the finFET in FIG. 7, according to one embodiment. Specifically, FIG. 8 illustrates the cross section indicated by A-A in FIG. 7. As shown, gate 705A overlaps fin 715A to form the gate capacitance used to switch the finFET between the active and inactive states. The finFET also include spacers 810 which enable the designer to control the location of the gate 705A on the FET thereby controlling the gate capacitance.

The contact 710A is in direct contact both physically and electrically with the fin 715A. Doing so drives the value of the voltage rail 725A onto the portion of the fin 715A proximate to the contact 710A. For example, the portion of the fin 715A to the left of the gate 705 may be heavily doped either n-type or p-type to provide a low resistance electrical conductor.

The dummy gate 735A overlaps an end of the fin 715A, which, as discussed above, generates a decoupling capacitor. Moreover, the dummy gate 735A is driven to a first voltage rail (e.g., $V_{HIGH}$) while contact 710A and fin 715A are driven to a second, different voltage rail (e.g., $V_{LOW}$). In this example, the fin 715A does not extend all the way through the dummy gate 735A which may increase the decoupling capacitance relative to a finFET where the fin 715A extends all the way through. However, in other embodiments, the fins 715 may extend through the dummy gates 735.

The spacers 805 lining the sides of the dummy gate 735A may have the same thickness or a different thickness than the spacers 805 lining the sides of the gate 705A.

Figure 9:
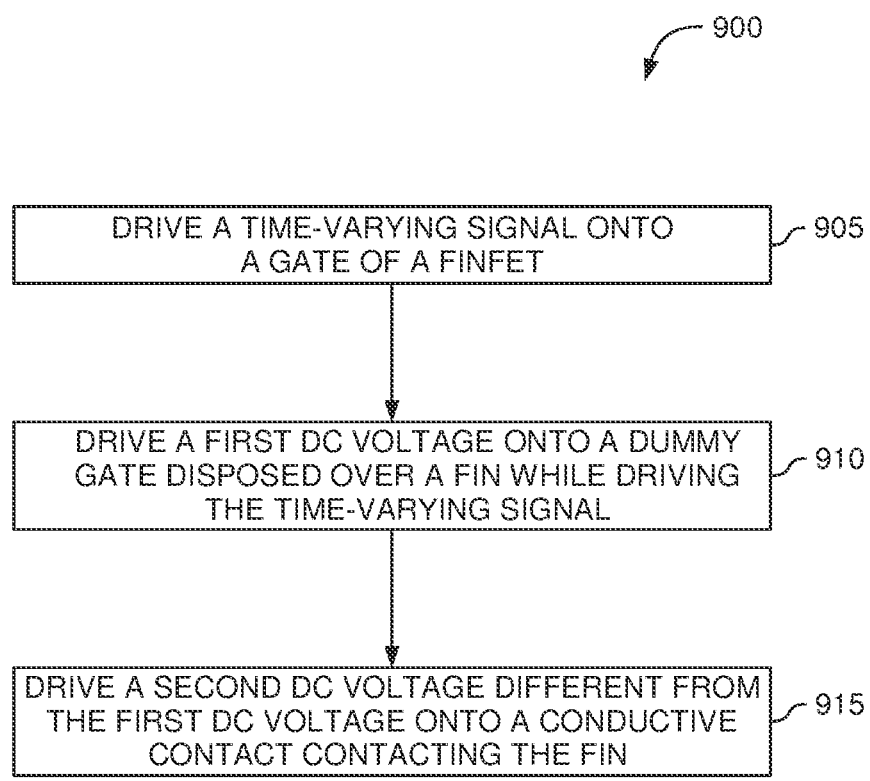
FIG. 9 illustrates a flow chart for operating a finFET, according to one embodiment.

FIG. 9 illustrates a flow chart 900 for operating a finFET, according to one embodiment. For clarity, the flow chart 900 is described using the finFET illustrated in FIG. 2; however it should be noted that this method is not limited to this structure. At block 905, an integrated circuit drives the time-varying gate signal 220 onto the gate 205 of the finFET 200. As above, the gate signal 220 selectively activates a conductive channel in the underlying fin—e.g., fin 215A, fin 215B, and fin 215C—which provides an electrical path for charge to flow from a portion of the fin on the left side of gate 205 to a portion of the fin on the right side of gate 205 (or vice versa).

At block 910, the integrated circuit drives a first DC voltage onto the dummy gate 235A disposed over the fin while driving the time-varying gate signal 220. In one embodiment, the first DC voltage is driven on the voltage rail 240 which is directly coupled to conductive material of the dummy gate 235A.

At block 915, the integrated circuit drives a second DC voltage different from the first DC voltage onto the conductive contact 210B contacting the fin while driving the time-varying gate signal. In FIG. 2, the contact 210B is coupled to portions of the fins 215A-C that are between portions of the fins 215A-C disposed underneath the gate 205 and portions of the fins 215A-C disposed underneath the dummy gate 235A. Because of the overlap between the dummy gate 235A and the fins 215A-C, the first and second DC voltages establish a voltage difference across the decoupling capacitor.

CONCLUSION

The increased gate capacitance of finFETs relative to planar FET technologies may cause the rail voltages coupled to the finFETs to droop as the gate voltages change. This droop can have a negative impact on the timing of the semiconductor circuit—e.g., cause the finFETs to operate at slower frequencies. To counter the effects of the gate capacitance, dummy gates can be placed over a portion of a fin in the finFETs. That is, instead of separating the dummy gates from the finFET structure, the fins may be extended and covered, at least partially, by the dummy gates. A dielectric material is disposed between the dummy gate and the fin in order to form a decoupling capacitor.

In one embodiment, the dummy gate overlaps a portion of the fin that is held at a rail voltage. Moreover, the dummy gate may be coupled to a different (e.g., opposite) rail voltage. For example, if the fin is coupled to $V_{HIGH}$ (e.g., VDD) then the dummy gate is coupled to $V_{LOW}$ (e.g., VSS), and vice versa. Thus, the capacitor formed using the fin and the dummy gate provides a decoupling capacitance between the power sources generating the voltage rails (i.e., $V_{HIGH}$ and $V_{LOW}$). This decoupling capacitance mitigates the negative effects of the large gate capacitance in the finFETs and may reduce or prevent the voltage rails from drooping, thereby permitting the finFETs to operate at faster frequencies.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A fin field effect transistor (FET) comprising:
a fin extending in a first direction on a substrate;
a gate extending in a second direction on the substrate substantially perpendicular to the first direction, wherein the gate is disposed over a first portion of the fin in order to selectively activate a conductive channel in the first portion of the fin in response to a time-varying gate signal;
a dummy fin structure extending in the second direction on the substrate and overlapping a second portion of the fin, wherein the dummy fin structure is coupled to a first voltage rail;
a conductive contact contacting a third portion of the fin located between the first and second portions, the contact electrically coupling the third portion of the fin to a second voltage rail different from the first voltage rail; and
a dielectric material disposed between the dummy fin structure and the second portion of the fin, whereby the dielectric material and second portion of the fin form a decoupling capacitance between the first and second voltage rails.

2. The finFET of claim 1, wherein the first and second voltage rails are coupled to first and second DC power supplies, wherein the first DC power supply is configured to generate a first DC voltage and the second DC power supply is configured to generate a second DC voltage different from the first DC voltage.

3. The finFET of claim 1, wherein the dummy fin structure surrounds the second portion of the fin on at least three sides.

4. The finFET of claim 3, wherein the fin does not extend through the dummy fin structure.

5. The finFET of claim 1, further comprising:
a second fin extending in the first direction on the substrate, wherein the gates is disposed over a first portion of the second fin in order to selectively activate a conductive channel in the first portion of the second fin in response to the time-varying gate signal, and wherein the dummy fin structure overlaps a second portion of the second fin, and
wherein the conductive contact couples with a third portion of the second fin that is located between the first and second portions of the second fin.

6. The finFET of claim 1, further comprising:
a second dummy fin structure extending in the second direction on the substrate and overlapping a fourth portion of the fin, wherein the second dummy fin structure is coupled to a second voltage rail; and
a second conductive contact coupled with a fifth portion of the fin located between the first and fourth portions of the fin, the contact electrically coupling the fifth portion of the fin to a fourth voltage rail different from the third voltage rail.

7. The finFET of claim 6, further comprising:
a dielectric material disposed between the second dummy fin structure and the fourth portion of the fin, whereby the dielectric material and fourth portion of the fin form a decoupling capacitance between the third and fourth voltage rails.

8. The finFET of claim 7, wherein the second voltage rail is different from the fourth voltage rail.

9. The finFET of claim 6, further comprising:
a second gate extending in the second direction on the substrate substantially perpendicular to the first direction, wherein the second gate is disposed over a sixth portion of the fin in order to selectively activate a second conductive channel in the sixth portion of the fin in response to a second time-varying gate signal.

10. An integrated circuit, comprising:
a fin extending in a first direction on a substrate;
a gate extending in a second direction on the substrate substantially perpendicular to the first direction, wherein the gate is disposed over a first portion of the fin in order to selectively activate a conductive channel in the first portion of the fin in response to a time-varying gate signal; and
a dummy fin structure extending in the second direction on the substrate and overlapping a second portion of the fin, wherein the dummy fin structure is coupled to a first voltage rail; and
a conductive contact coupled with a third portion of the fin located between the first and second portions, the contact electrically coupling the third portion of the fin to a second voltage rail different from the first voltage rail,
wherein the dummy fin structure surrounds the second portion of the fin on at least three sides, and wherein the fin does not extend through the dummy fin structure.

11. The integrated circuit of claim 10, further comprising:
a dielectric material disposed between the dummy fin structure and the second portion of the fin, whereby the dielectric material and second portion of the fin form a decoupling capacitance between the first and second voltage rails.

12. The integrated circuit of claim 10, further comprising:
a second fin extending in the first direction on the substrate, wherein the gates is disposed over a first portion of the second fin in order to selectively activate a conductive channel in the first portion of the second fin in response to the time-varying gate signal, and wherein the dummy fin structure overlaps a second portion of the second fin, and wherein the conductive contact couples with a third portion of the second fin that is located between the first and second portions of the second fin.

13. A method of operating a finFET, comprising:
driving a time-varying gate signal onto a gate extending in a first direction on a substrate, wherein the gate is disposed over a first portion of a fin extending in a second direction on the substrate substantially perpendicular to the first direction, and wherein the time-varying signal selectively activates a conductive channel in the first portion of the fin;

while driving the time-varying gate signal, driving a first DC voltage on a dummy fin structure extending in the second direction on the substrate, the dummy fin structure overlapping a second portion of the fin;

while driving the time-varying gate signal, driving a second DC voltage different from the first DC voltage on a conductive contact contacting a third portion of the fin that is located between the first and second portions;

receiving the first DC voltage from a first DC power supply; and receiving the second DC voltage rail from a second DC power supply.

14. The method of claim 13, wherein a dielectric material is disposed between the dummy fin structure and the second portion of the fin, whereby the dielectric material and second portion of the fin form a decoupling capacitance between the first and second DC voltages.

15. The method of claim 13, wherein the dummy fin structure surrounds the second portion of the fin on at least three sides.

16. The method of claim 15, wherein the fin does not extend through the dummy fin structure.

* * * * *